US009041021B2

(12) United States Patent
Chieh

(10) Patent No.: US 9,041,021 B2
(45) Date of Patent: May 26, 2015

(54) LED LIGHT ASSEMBLY

(71) Applicant: Shanghai Huan Hsin Electronics Co., Ltd., Shanghai (CN)

(72) Inventor: Hsu Meng Chieh, Shanghai (CN)

(73) Assignee: SHANGHAI HUAN HSIN ELECTRONICS CO., LTD., Shanghai (CN)

( * ) Notice: Subject to any disclaimer, the term of this patent is extended or adjusted under 35 U.S.C. 154(b) by 112 days.

(21) Appl. No.: 13/917,715

(22) Filed: Jun. 14, 2013

(65) Prior Publication Data

US 2014/0367704 A1 Dec. 18, 2014

(51) Int. Cl.
*H01L 33/00* (2010.01)
*F21K 99/00* (2010.01)

(52) U.S. Cl.
CPC ........... *F21K 9/00* (2013.01); *H01L 2251/5361* (2013.01)

(58) Field of Classification Search
CPC ................ H01L 2251/5338; H01L 2251/5361
USPC ............................................ 362/382; 257/88
See application file for complete search history.

(56) References Cited

U.S. PATENT DOCUMENTS

| | | | | |
|---|---|---|---|---|
| 8,360,608 | B2 * | 1/2013 | Wildner | 362/249.04 |
| 8,531,109 | B2 * | 9/2013 | Visser et al. | 315/88 |
| 2010/0091494 | A1 * | 4/2010 | Pearson et al. | 362/249.02 |

* cited by examiner

*Primary Examiner* — Long K Tran
(74) *Attorney, Agent, or Firm* — Bacon & Thomas, PLLC

(57) ABSTRACT

An LED assembly includes a rail device, an LED carrier with multiple LEDs securely mounted on the LED carrier and a wire extended out of the LED carrier from providing electricity to the LEDs and a plug device provided to two distal ends of the LED carrier and sandwiched in the rail device. The plug device has a passage defined in one distal end thereof to allow the wire to extend out of the plug device and a positioning seat is sandwiched in the rail device and provided to two sides of the plug device and has a receiving space to respectively and securely accommodate therein sides of the plug device.

14 Claims, 4 Drawing Sheets

LED LIGHT ASSEMBLY

CROSS-REFERENCE TO RELATED APPLICATION

Not available.

FIELD OF THE INVENTION

The invention relates to an LED light assembly, and more particularly to an LED light assembly having rails provided to sandwich an LED carrier and plugs provided to both sides of the LED carrier so as to securely position the LED carrier inside the rails.

BACKGROUND OF THE INVENTION

Conventionally, when an LED light string is used, multiple light emitting diodes (LED) are electrically connected together and an aluminum bar with a predetermined length is used to structurally connect each and every one of the LEDs. After which, circuit boards with a predetermined space defined between two adjacent circuit boards are fixed to the aluminum bar. Then the aluminum bar with multiple circuit boards is affixed to a commercial box, e.g. a neon box. When this type of LED light string is used, it is to be noted that the circuit boards are not easily affixed to the aluminum bar and the aluminum bar is, again not fixed to the neon box easily. Even after the aluminum bar with the circuit boards is placed in position, the mounting of the LED light string is not safe and potential risk of having a short is great.

Even though, numerous attempts were made to improve such drawbacks, failures were inevitable as there has not been any successful assembly introduced to the market to solve or diminish the problem.

In order to obviate the problems that the conventional LED light string encountered, it is an objective of the present invention to provide an improved LED light assembly.

SUMMARY OF THE INVENTION

The primary objective of the present invention is to provide an LED light assembly having rails, an LED carrier sandwiched between the rails and plugs provided on both sides of the LED carrier to securely and immovably position the LED carrier.

Another objective of the present invention is to provide a positioning seat provided to each one of the plugs so as to sandwich the plug with the LED carrier.

Still, another objective of the present invention is that a passage is defined in each plug for extension of an electrical wire for providing electricity to the LEDs.

Another objective of the present invention is that the positioning seat has a receiving room defined in a side face thereof to accommodate therein an end of one of the plugs.

A further objective of the present invention is that the positioning seat has a through hole defined to communicate with the passage to allow the electrical wire to extend therethrough.

DETAILED DESCRIPTION OF THE INVENTION

The following description is merely exemplary in nature and in no way intended to limit the present teachings, applications, or uses. Those of skill in the art will recognize that the following description is merely illustrative of the principles of the invention, which may be applied in various ways to provide is many different alternatives embodied in the preferred embodiment of the present invention.

Figure 1:
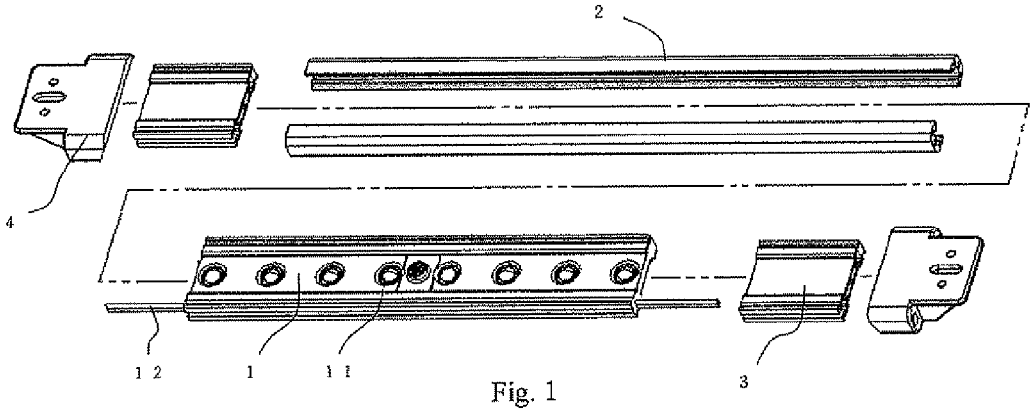
FIG. 1 is an exploded perspective view showing elements of the LED light assembly of the preferred embodiment of the present invention.

With reference to FIG. 1, the LED light assembly constructed in accordance with the present invention includes an LED carrier 1, a rail device 2 having the LED carrier 1 sandwiched there between, plugs 3 respectively provided to one distal end of the LED carrier 1 and positioning seats 4 respectively provided to one side of the plugs to securely position the plugs 3 and the LED carrier 1 inside the rail device 2.

Figure 3:
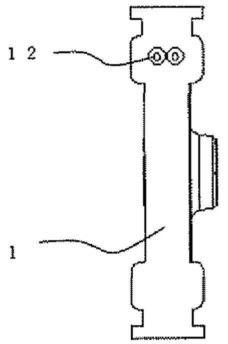
FIG. 3 is a schematic side plan view showing the profile of the LED carrier of the preferred embodiment of the present invention.

It is noted that the LED carrier 1 may be made of a flexible material or a solid material and have plural LEDs 11 securely mounted on the LED carrier 1 and a wire 12 extending through the LED carrier 1 to provide electricity to the LEDs 11, as shown in FIG. 3.

Figure 2:
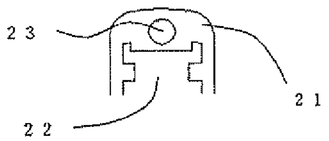
FIG. 2 is an end plan view showing the profile of the rail of the preferred embodiment of the present invention.
Figure 4:
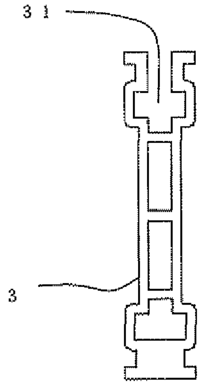
FIG. 4 is a side plan view showing the internal structure of the plug of the preferred embodiment of the present invention.

With reference to FIG. 2, an end view of the rail device 2 is shown, wherein the rail device 2 preferably has two tracks 21 oppositely provided with respect to one another. Each track 21 defines therein an open end 22 and has a positioning hole 23. FIG. 4 shows the internal structure of one of the plugs 3, wherein the plug 3 is made with several hollow portions for saving material and a passage 31 defined in one distal end thereof to allow extension of the wire 12 from the LED carrier 1. Especial attention is required to the profile of the outline of the plug 3 is substantially the same as that of the outline of the distal end of the LED carrier 1 so that when either one of the plugs 3 is placed next to the LED carrier 1, the plug 3 is perfectly matched with the LED carrier 1.

Figure 5:
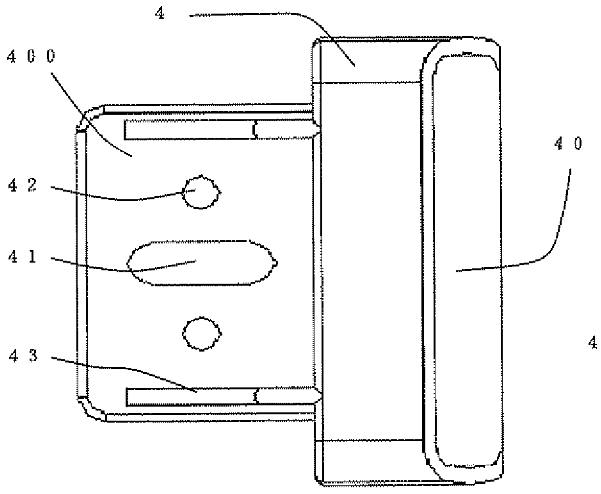
FIG. 5 is a side plan view showing the positioning seat of the preferred embodiment of the present invention.
Figure 6:
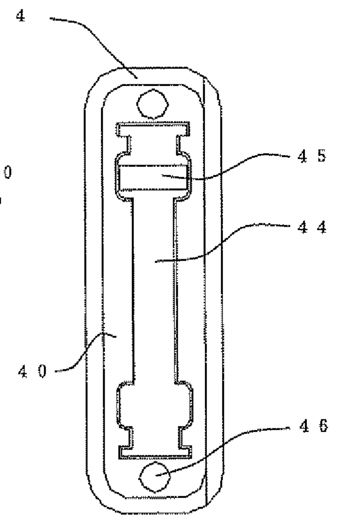
FIG. 6 is still a side plan view of the positioning seat of the preferred embodiment of the present invention in an angle different from that of FIG. 5.
Figure 7:
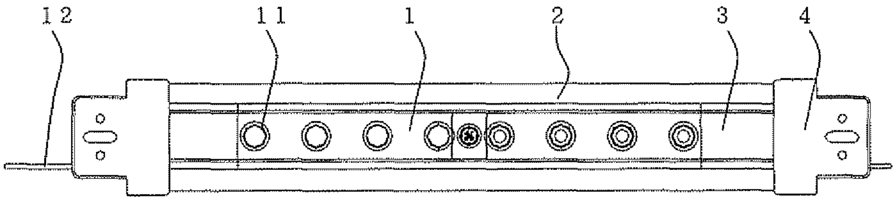
FIG. 7 is a side plan view showing the assembly of the preferred embodiment of the present invention.

With reference to FIGS. 5 and 6, it is noted that there are provided with two positioning seats 4. Each positioning seat 4 is provided with a receiving space 40 in a side thereof to accommodate the other distal end of one of the plugs 3, a wing 400 integrally extending from the positioning seat 4 and having an elongated hole 41 and two holes 42 respectively defined alongside the elongated hole 41, preferably, in opposite direction with respect to one another and a reinforced rib 43 formed on a side face of the wing 400 to reinforce the integrity and strength of the wing 400. With the elongated hole 41, the LED assembly after being assembled is able to be hung on a place such as a ceiling. The two holes 42 enable the assembled assembly to be fixed on such as a wall.

At a bottom face defining the receiving space 40, a recess 44 is defined to have an outline matched with the outline of the plug 3 such that when one end of the plug 3 is extended into the receiving space 40, the distal end of the plug 3 is able to be snugly and securely received in the recess 44, a through hole 45 defined in a bottom face defining the recess 44 to communicate with the passage 31 of the plug 3 so that after the plug 3 is perfectly received in the recess 44, the wire 12 is able to extend out of the passage 31 and then out of the through hole 45 and fixing holes 46.

When the LED light assembly constructed in accordance with the preferred embodiment of the present invention is to be assembled, the LED carrier 1 is inserted into the two tracks 21. It is noted that the internal structure of the track 21 corresponds to one end of the LED carrier 1 such that after the LED carrier 1 is inserted into two oppositely placed tracks 21, the LED carrier 1 is able to have perfect connection to the rail device 2. Then, two plugs 3 are respectively and oppositely placed on two distal ends of the LED carrier 1. As the outline of each of the plugs 3 perfectly matches the cross section of the LED carrier 1, so as the internal structure of the open end 22 of the track 21, the plugs 3 are able to securely and tightly fitted to both ends of the tracks 21 as well as the LED carrier 1. In the meantime, the wire 12 extends out of the plugs 3 from the passages 31. Thereafter, the two positioning seats 4 are respectively and oppositely provided to each one of the two plugs 3. The distal ends of the two plugs 3 are respectively extended into the receiving space 40 and eventually received in the recesses 44 and the wires 12 extend out of the two positioning seats 4 from the through holes 45. After the two positioning seats 4 are inserted into the two tracks 21 and the distal ends of the two plugs 3 are snugly yet securely received in the recesses 44, a securing element such as screws, threaded bolts or the like is employed to extend through the fixing holes 46 and into the positioning holes 23 of the tracks 21 to completely secure the assembly of the preferred embodiment of the present invention.

It is to be noted that although the preferred embodiment of the present invention has been described, other modifications, alterations or minor change to the structure should still be within the scope defined in the claims. As those skilled in the art will readily observe that numerous modifications and alterations of the device and method may be made while retaining the teachings of the invention.

What is claimed is:

1. An LED assembly consisting essentially of:

a rail device, wherein the rail device has two independent tracks each having an open end corresponding to a portion of an outline of the LED carrier, an internal structure of the open end of each of the two track is adapted to correspond to a partial outline of the LED carrier such that the LED carrier is able to be sandwiched between the two tracks;

an LED carrier with multiple LEDs securely mounted on the LED carrier and a wire extended out of the LED carrier for providing electricity to the LEDs;

a plug device abutted to two respective distal ends of the LED carrier and sandwiched in the rail device, the plug device having a passage defined in one distal end thereof to allow the wire to extend out of the plug device; and a positioning seat sandwiched in the rail device and provided to two respective sides of the plug device and having a receiving space to respectively and securely accommodate therein sides of the plug device.

2. The LED assembly as claimed in claim 1, wherein the plug device has an outline perfectly matched with that of the LED carrier such that after the plug device is provided to the distal ends of the LED carrier, the plug device is able to mate with the LED carrier.

3. The LED carrier as claimed in claim 2, wherein the positioning seat has a receiving space defined in one side thereof to accommodate one end of the plug device and a recess defined in a bottom face defining the receiving space to snugly yet securely receive therein one end of the plug device.

4. The LED carrier as claimed in claim 3, wherein the positioning seat has a wing extending out and having reinforced rib to reinforce strength of the wing, and an elongated hole defined therein and two holes oppositely defined in the wing with respect to the elongated hole.

5. The LED carrier as claimed in claim 2, wherein the positioning seat has a receiving space defined in one side thereof to accommodate one end of the plug device, a recess defined in a bottom face defining the receiving space to snugly yet securely receive therein one end of the plug device and a through hole in communication with the passage to allow the wire to extend out of the positioning seat.

6. The LED carrier as claimed in claim 5, wherein the positioning seat has a wing extending out and having reinforced rib to reinforce strength of the wing, and an elongated hole defined therein and two holes oppositely defined in the wing with respect to the elongated hole.

7. The LED carrier as claimed in claim 2, wherein the positioning seat has a wing extending out and having reinforced rib to reinforce strength of the wing, and an elongated hole defined therein and two holes oppositely defined in the wing with respect to the elongated hole.

8. The LED assembly as claimed in claim 7, wherein the plug device has an outline perfectly matched with that of the LED carrier such that after the plug device is provided to the distal ends of the LED carrier, the plug device is able to mate with the LED carrier, the positioning seat has two fixing holes respectively corresponding to and communicating with the positioning holes of the tracks of the rail device.

9. The LED carrier as claimed in claim 1, wherein the positioning seat has a receiving space defined in one side thereof to accommodate one end of the plug device and a recess defined in a bottom face defining the receiving space to snugly yet securely receive therein one end of the plug device.

10. The LED carrier as claimed in claim 9, wherein the positioning seat has a wing extending out and having reinforced rib to reinforce strength of the wing, and an elongated hole defined therein and two holes oppositely defined in the wing with respect to the elongated hole.

11. The LED assembly as claimed in claim 10, wherein the plug device has an outline perfectly matched with that of the LED carrier such that after the plug device is provided to the distal ends of the LED carrier, the plug device is able to mate with the LED carrier, the positioning seat has two fixing holes respectively corresponding to and communicating with the positioning holes of the tracks of the rail device.

12. The LED carrier as claimed in claim 9, wherein the positioning seat has two fixing holes respectively corresponding to and communicating with the positioning holes of the tracks of the rail device.

13. The LED assembly as claimed in claim 12, wherein the plug device has an outline perfectly matched with that of the LED carrier such that after the plug device is provided to the distal ends of the LED carrier, the plug device is able to mate with the LED carrier, the positioning seat has two fixing holes respectively corresponding to and communicating with the positioning holes of the tracks of the rail device.

14. The LED carrier as claimed in claim 1, wherein the positioning seat has a receiving space defined in one side thereof to accommodate one end of the plug device, a recess defined in a bottom face defining the receiving space to snugly yet securely receive therein one end of the plug device and a through hole in communication with the passage to allow the wire to extend out of the positioning seat.

* * * * *